United States Patent
Kang et al.

(10) Patent No.: US 7,994,492 B2
(45) Date of Patent: Aug. 9, 2011

(54) PHASE CHANGE MATERIAL, PHASE CHANGE MEMORY DEVICE INCLUDING THE SAME, AND METHODS OF MANUFACTURING AND OPERATING THE PHASE CHANGE MEMORY DEVICE

(75) Inventors: Youn-seon Kang, Seoul (KR); Ki-joon Kim, Hwaseong-si (KR); Cheol-kyu Kim, Seoul (KR); Tae-yon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 395 days.

(21) Appl. No.: 12/232,661

(22) Filed: Sep. 22, 2008

(65) Prior Publication Data
US 2009/0196089 A1    Aug. 6, 2009

(30) Foreign Application Priority Data
Feb. 1, 2008   (KR) .......................... 10-2008-0010817

(51) Int. Cl.
*H01L 45/00*   (2006.01)

(52) U.S. Cl. .............. 257/2; 257/3; 257/4; 257/E45.003

(58) Field of Classification Search .................. 257/1–5, 257/E45.001–E45.003; 365/148; 438/95, 438/900
See application file for complete search history.

(56) References Cited

U.S. PATENT DOCUMENTS

| | | | |
|---|---|---|---|
| 7,750,335 B2* | 7/2010 | Clevenger et al. | 257/4 |
| 2008/0094885 A1* | 4/2008 | Ho et al. | 365/163 |
| 2009/0039331 A1* | 2/2009 | Clevenger et al. | 257/4 |
| 2009/0078924 A1* | 3/2009 | Liang et al. | 257/3 |
| 2009/0230375 A1* | 9/2009 | Liang et al. | 257/2 |
| 2010/0054029 A1* | 3/2010 | Happ et al. | 365/163 |

* cited by examiner

*Primary Examiner* — Anh Phung
*Assistant Examiner* — Michael Lulis
(74) *Attorney, Agent, or Firm* — Harness, Dickey & Pierce, P.L.C.

(57) ABSTRACT

Disclosed may be a phase change material alloy, a phase change memory device including the same, and methods of manufacturing and operating the phase change memory device. The phase change material alloy may include Si and Sb. The alloy may be a Si—O—Sb alloy further including O. The Si—O—Sb alloy may be $Si_xO_ySb_z$, wherein, when $x/(x+z)$ may be x1, $0.05 \leq x1 \leq 0.30$, $0.00 \leq y \leq 0.50$, and $x+y+z$ may be 1. The Si—O—Sb alloy may further comprise an element other than Si, O, and Sb.

14 Claims, 16 Drawing Sheets

US 7,994,492 B2

PHASE CHANGE MATERIAL, PHASE CHANGE MEMORY DEVICE INCLUDING THE SAME, AND METHODS OF MANUFACTURING AND OPERATING THE PHASE CHANGE MEMORY DEVICE

PRIORITY STATEMENT

This application claims priority under U.S.C. §119 to Korean Patent Application No. 10-2008-0010817, filed on Feb. 1, 2008, in the Korean Intellectual Property Office (KIPO), the entire contents of which are incorporated herein by reference.

BACKGROUND

1. Field

Example embodiments relate to a phase change material, a phase change memory device including the same, and methods of manufacturing and operating the phase change memory device.

2. Description of the Related Art

A semiconductor memory device should be able to store relatively large amounts of data in a relatively small region, maintain stored data for extended periods of time without loss of data even when no power is supplied, and write/read data to/from the semiconductor memory device quickly and precisely. Recently proposed non-volatile memory devices may be highly integrated and have relatively fast operating speeds. An example of the non-volatile semiconductor memory devices may be a phase change random access memory device.

A phase change memory device may store data using the phase change characteristics of a phase change material. In other words, in a phase change material, electrical resistance of the phase change material may differ according to whether the phase change material is in a crystalline state or an amorphous state. The phase change memory device uses this characteristic to store data.

Therefore, operating characteristics of a phase change memory device may be affected by characteristics of a phase change material. GST ($Ge_2Sb_2Te_5$), for example, an alloy of germanium, antimony, and tellurium, may be the most well-known phase change material. A crystallizing temperature Tc of GST may be about 160° C. A set time of GST, which may be the time required for GST to change its state from an amorphous state to a crystalline state, may be about 150 ns.

Although the crystallizing temperature Tc and the set time of GST may not be significant obstacles for an operation of a phase change memory device including GST, the efficiency of phase change memory devices needs to improve in consideration of rapidly changing demands of the memory device market. Therefore, current research may be focused on reducing the set time of a phase change material used in a phase change memory device and raising the crystallizing temperature Tc of the phase change material to prevent or reduce loss of data due to an operating condition of the phase change memory device.

SUMMARY

Example embodiments provide a phase change material which may be used in and applied to various fields, where the phase change material has improved phase change characteristics. Example embodiments also provide a phase change memory device using the phase change material. Example embodiments also provide methods of manufacturing and operating the phase change memory device.

According to example embodiments, a phase change material may include an alloy composed of silicon (Si) and antimony (Sb). The alloy may further include oxygen (O), and the alloy is in the form of Si—O—Sb. The Si—O—Sb alloy may be $Si_xO_ySb_z$, wherein when $x/(x+z)$ may be x1, $0.05 \leq x1 \leq 0.30$, $0.00 \leq y \leq 0.50$, and $x+y+z$ may be 1. The Si—O—Sb alloy may further include an element other than Si, O, and Sb. According to example embodiments, there may be provided a phase change memory device including a switching device and a storage node connected to the switching device, wherein the storage node may be formed of a layer including the phase change material of example embodiments.

According to example embodiments, a method of manufacturing a phase change memory device may include forming a switching device and forming a storage node, wherein forming the storage node includes forming a lower layer connected to the switching device, forming a phase change material layer on the lower layer, and forming an upper layer on the phase change material layer, wherein the phase change material layer is formed of a phase change material including an alloy composed of Si and Sb.

According to example embodiments, a method of operating a phase change memory device may include maintaining a switching element connected to a phase change memory layer in an ON state, and applying an operating voltage to the phase change memory layer between upper and lower layers, wherein the phase change material layer is formed of a phase change material including an alloy composed of Si and Sb.

BRIEF DESCRIPTION OF THE DRAWINGS

Example embodiments will be more clearly understood from the following detailed description taken in conjunction with the accompanying drawings.

FIG. 1 is a block diagram roughly illustrating a phase change memory device according to example embodiments;

FIGS. 2 and 3 are cross-sectional views showing various modified configurations of a storage node of the phase change memory device of FIG. 1, according to example embodiments;

FIGS. 4-27 are graphs showing result of characteristic tests of a phase change material layer used in a phase change memory device according to example embodiments;

FIG. 28 is a graph showing a result of a switching test of a phase change memory device in which the phase change material layer corresponding to experimental results shown in FIGS. 4-27 may be used according to example embodiments;

FIG. 29 is a cross-sectional view of a storage node of the phase change memory device used in the switching test shown in FIG. 28, according to example embodiments; and FIGS. 30-32 are cross-sectional views illustrating a method of manufacturing a phase change memory device, according to example embodiments.

Figure 1:
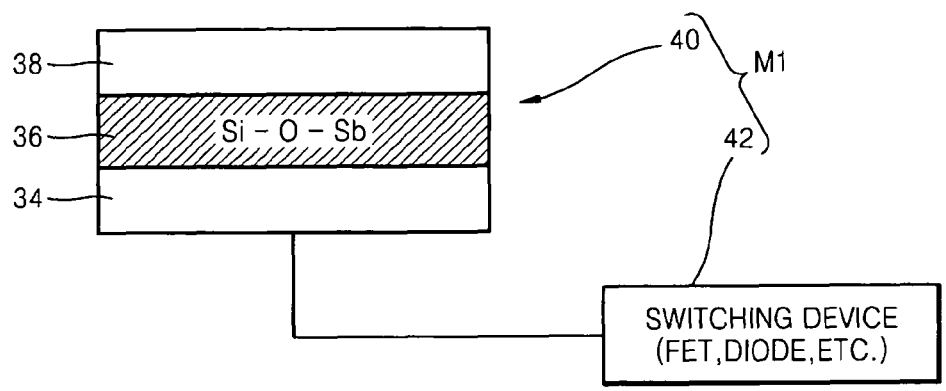
FIGS. 1-32 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/ or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Detailed example embodiments are disclosed herein. However, specific structural and functional details disclosed herein may be merely representative for purposes of describing example embodiments. Example embodiments may, however, be embodied in many alternate forms and should not be construed as limited to only the embodiments set forth herein.

Accordingly, while example embodiments may be capable of various modifications and alternative forms, embodiments thereof may be shown by way of example in the drawings and will herein be described in detail. It should be understood, however, that there may be no intent to limit example embodiments to the particular forms disclosed, but to the contrary, example embodiments may be to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms may be only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element may be referred to as being "connected" or "coupled" to another element, it may be directly connected or coupled to the other element or intervening elements may be present. In contrast, when an element may be referred to as being "directly connected" or "directly coupled" to another element, there may be no intervening elements present. Other words used to describe the relationship between elements should be interpreted in a like fashion (e.g., "between" versus "directly between", or "adjacent" versus "directly adjacent").

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved. Example embodiments will now be described more fully with reference to the accompanying drawings. In the drawings, the thicknesses of layers and regions may be exaggerated for clarity. A phase change material and a phase change memory device, according to example embodiments, will be described in detail. Description on the phase change memory device will be included to description on the phase change material.

FIG. 1 is a block diagram roughly illustrating a phase change memory device M1 according to example embodiments. Referring to FIG. 1, the phase change memory device M1 according to example embodiments may include a storage node 40 and a switching device 42. The storage node 40 may include a bottom electrode 34, a phase change material layer 36, and a top electrode 38. The bottom electrode 34, the phase change material layer 36, and the top electrode 38 may be stacked in this sequential order. The top electrode 38 and the bottom electrode 34 may be conventional top and bottom electrodes forming a storage node of a phase change memory device. The bottom electrode 34 may be connected to the switching device 42 either directly or indirectly. The configuration of the bottom electrode 34 may vary, and a description thereof will be provided later.

The phase change material layer 36 may include a phase change material alloy including silicon (Si) and antimony (Sb). In other words, the phase change material layer 36 may be a Si—Sb alloy layer. Also, the phase change material layer 36 may include a phase change material including a chalcogenide but no tellurium (Te). The phase change material layer 36 may be a Si—Sb alloy layer including oxygen (O), for example, a Si—O—Sb alloy layer. An example of a Si—O—Sb alloy layer may be $Si_xO_ySb_z$, wherein, if $x/(x+z)$ is x1, then the equations about $0.05 \leq x1 \leq$ about 0.30 (or about 5 atomic percent $\leq x1 \leq$ about 30 atomic percent), about $0.00 \leq y \leq$ about 0.50, and $x+y+z=1$ are true. Referring to the relationships above, the value of y in the Si—Sb alloy may be zero in $Si_xO_ySb_z$.

A crystallizing temperature Tc of the phase change material layer 36 may be about 200° C. or higher. Therefore, a phase change memory device according to example embodiments may be thermally more stable than a conventional phase change memory device using GST as a phase change material. In other words, a characteristic of maintaining data, for example, retention characteristic of the phase change memory device according to example embodiments, may be favorable when compared with a conventional phase change memory device.

Also, a set time of the phase change material layer 36, for example, the time required for the phase change material layer 36 to be crystallized may be dozens of nanoseconds. For example, when the phase change material layer 36 is a $Si_xO_ySb_z$ layer, the phase change material layer 36 may be changed from an amorphous state to a crystalline state even in a set pulse of about 20 ns. In other words, states of a phase change memory device including the phase change material layer 36 may be electrically switched in a set pulse of about 20 ns. Further description will be provided later when the crystallizing temperature Tc may be described. Meanwhile, the switching device 42 may be a field effect transistor (FET) or a diode, for example. However, example embodiments may not be limited thereto, and the switching device 42 may be another type of switching device.

Figure 2:
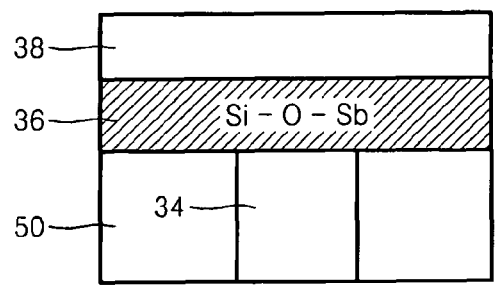
Figure 3:
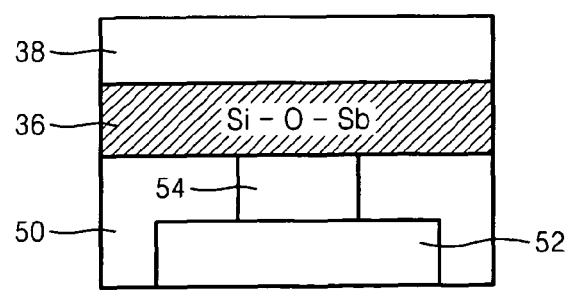

FIGS. 2 and 3 are cross-sectional views showing various configurations of a lower layer under the phase change material layer 36, according to example embodiments. Referring to FIG. 2, the lower layer may include an interlayer insulation layer 50 and the bottom electrode 34. The bottom electrode 34 may be surrounded by the interlayer insulation layer 50. The phase change material layer 36 may be formed on the interlayer insulation layer 50, and may contact the top surface of the bottom electrode 34 and the bottom surface of the top electrode 38. The bottom surface of the bottom electrode 34 may be connected to the switching device 42 (see FIG. 1).

Referring to FIG. 3, the lower layer may include the interlayer insulation layer 50, a bottom electrode 52, and a bottom electrode contacting layer 54. The bottom electrode 52 and the bottom electrode contacting layer 54 may be surrounded by the interlayer insulation layer 50. The bottom electrode contacting layer 54 may be disposed between the phase change material layer 36 and the bottom electrode 52. The bottom electrode contacting layer 54 may contact the bottom electrode 52 and the phase change material layer 36. The diameter of the bottom electrode 52 may be greater than that of the bottom electrode contacting layer 54. The bottom electrode 52 may be connected to the switching device 42. Although not shown, a thermal insulation layer surrounding the bottom electrode contacting layer 54 may be further disposed between the bottom electrode contacting layer 54 and the interlayer insulation layer 50. An experiment performed to evaluate characteristics of a phase change material layer according to example embodiments will be described below.

In the experiment, a silicon-oxide ($SiO_2$) layer having a thickness of about 99 nm may be formed on a silicon substrate. A $Si_xO_ySb_z$ layer having a thickness of about 200 nm may be formed on the silicon-oxide layer as an experimental phase change material layer. The experimental phase change material layer may be formed by co-sputtering a Si target and a Sb target. A DC power may be applied to the Si target, and a RF power may be applied to the Sb target. Because oxygen has an increased chemical attraction to Sb, oxygen may easily be contained in the thin film of the experimental phase change material layer while the experimental phase change material layer may be formed. The amount of oxygen may be controlled by using a reactive sputtering method using sputtering gas containing argon (Ar) and oxygen.

Figure 4:
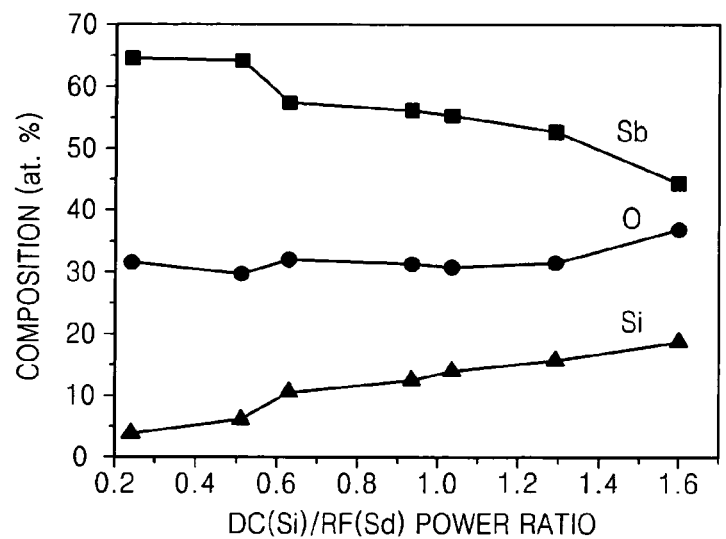

FIG. 4 is a graph showing a composition change of the experimental phase change material layer according to a ratio between the DC power applied to the Si target and the RF power applied to the Sb target. Referring to FIG. 4, a silicon content x of the experimental phase change material layer may be between about 0 to about 20 atomic percent, an antimony content z may be between about 40 to about 70 atomic percent, and an oxygen content y may be between about 30 to about 40 atomic percent, according to a ratio between the DC power and the RF power applied to the Si target and the Sb target. For example, the relative content between the Si and Sb $x1=x/(x+z)$ may be about $0.05 \leq x1 \leq$ about 0.30. In other words, the Si content as a percentage of the total Si and Sb content may be between about 5 to about 30 atomic percent.

Figure 5:
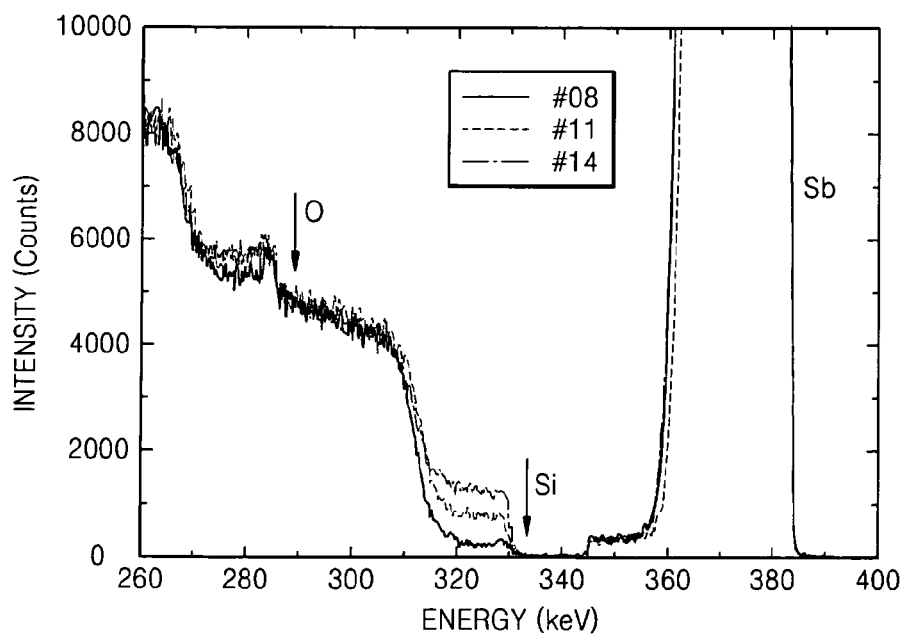

FIG. 5 is a graph showing an analysis of composition distribution of the experimental phase change material layer. The analysis may be performed by using a Rutherford Back-Scattering (RBS) method, and may be performed at various randomly selected locations on the experimental phase change material layer. In FIG. 5, duplicated graphs indicate results of analyzing composition distribution at the various randomly selected locations of the experimental phase change material layer. Referring to FIG. 5, peaks of Si, O, and Sb may be clear in duplicated graphs and in-graph positions of the peaks may be identical in all graphs. Based on the analysis, the distributions of Si, O, and Sb in the experimental phase change material layer may be uniform.

Figure 6:
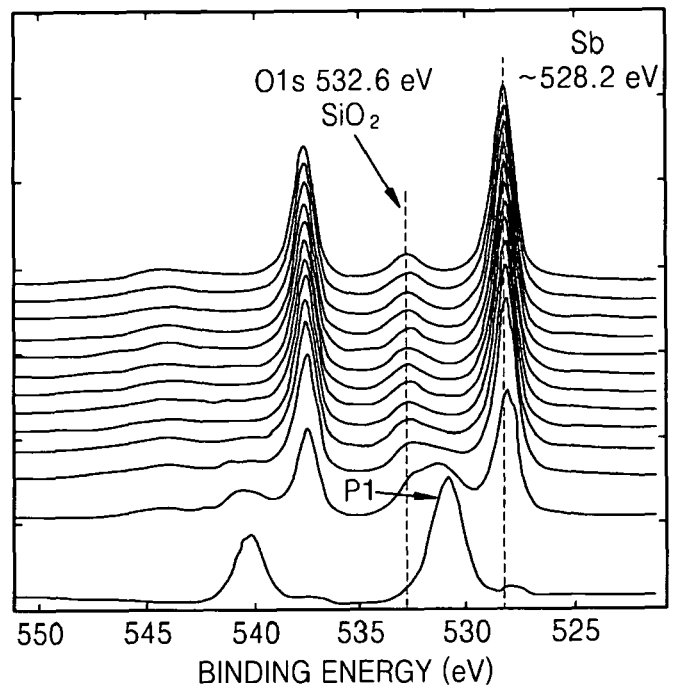
Figure 7:
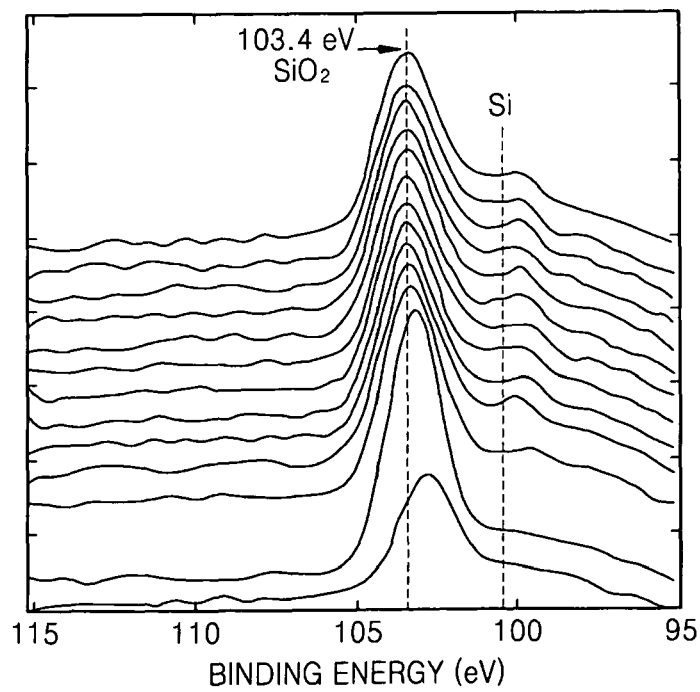
Figure 8:
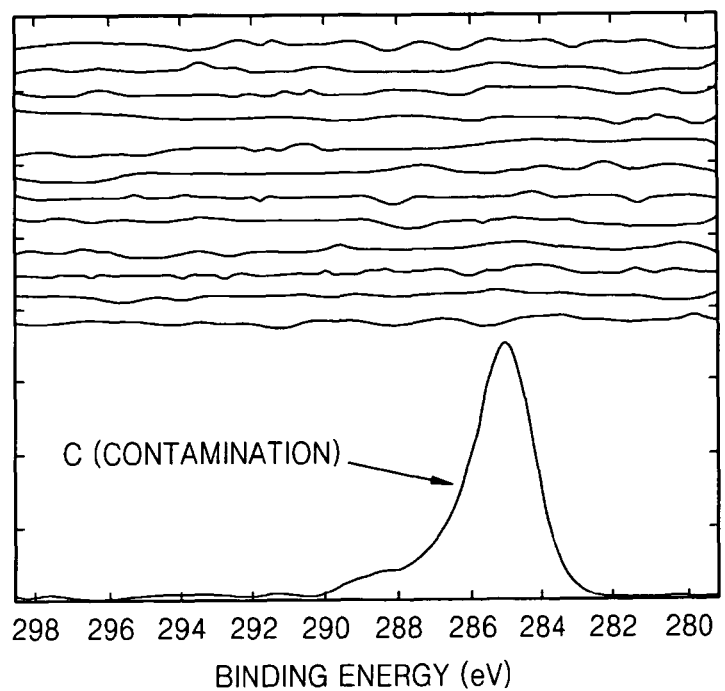

FIGS. 6-8 are graphs showing X-ray photoelectron spectroscopy (XPS) results of the experimental phase change material layer according to example embodiments. Referring to FIGS. 6-8, most of the oxygen may exist in the form of $SiO_2$ because oxygen has increased chemical attraction to Si, and may be uniformly distributed overall, as shown in FIGS. 6 and 7. Also, no impurities C may be detected in the thin film of the experimental phase change material layer except the outer surface of the experimental phase change material layer, as shown in FIG. 8. In FIG. 6, a peak P1 may be a peak of $Sb_2O_5$ on the outer surface of the experimental phase change material layer. Based on the XPS results shown in FIGS. 6 and 7, Sb may exist in the form of Sb—Sb bonding, oxygen may exist in the form of O—Si—O bonding, and Si may exist in the form of Si—Si and the form of O—Si—O.

Figure 9:
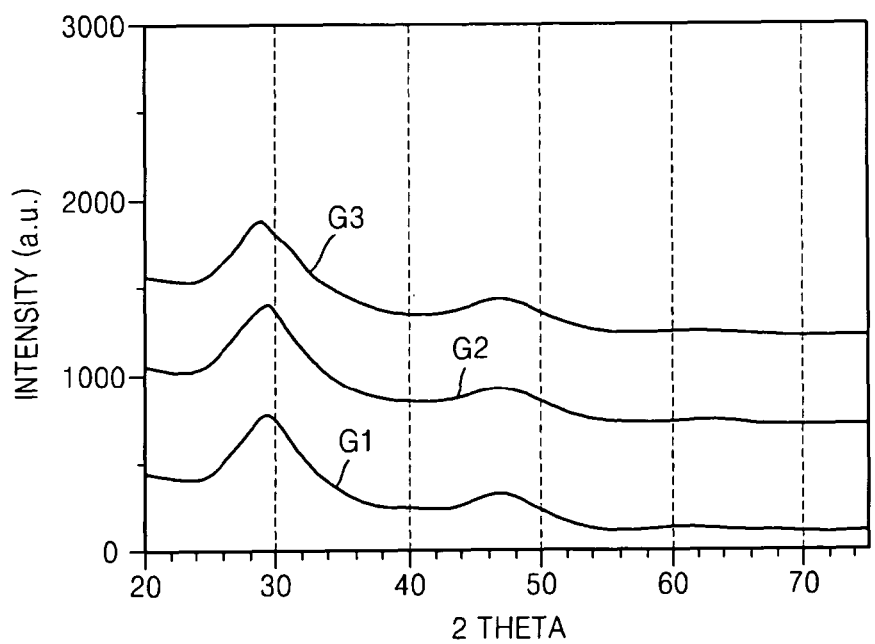
Figure 10:
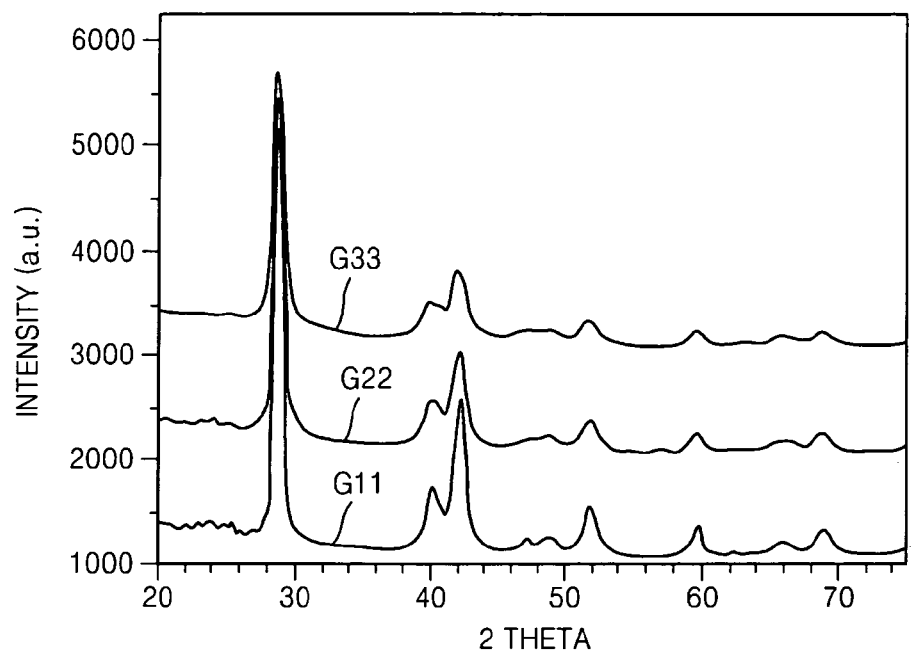

FIGS. 9 and 10 are graphs showing X-ray diffraction (XRD) analysis of experimental phase change material layers. FIG. 9 shows a XRD result obtained immediately after stacking the experimental phase change material layers, and FIG. 10 shows a XRD result obtained after rapid thermal treatment of the stacked experimental phase change material layers at about 300° C. for about two minutes in a nitrogen atmosphere.

In FIGS. 9 and 10, first graphs G1 and G11, second graphs G2 and G22, and third graphs G3 and G33 indicate XRD results of first, second, and third experimental phase change material layers. In the first experimental phase change material layer, the Si content as a percentage of the total Si and Sb content may be about 15.6 atomic percent. In other words,

[Si/(Si+Sb)] in the first experimental phase change material layer may be about 0.15 (about 15.6 atomic percent), about 0.20 (about 20.2 atomic percents) in the second experimental phase change material layer, and about 0.29 (about 29.6 atomic percent) in the third experimental phase change material layer.

Referring to FIG. 9, the first through third graphs G1 through G3 may be identically shaped. Considering that there may be no obvious peak other than a first peak PP1 in each of the graphs G1 through G3, the experimental phase change material layer immediately after deposition thereof may be in an amorphous state. Referring to FIG. 10, while the first through third graphs G11 through G33 may be identically shaped, there may be a second peak P22 other than the first peak P11 in each of the first through third graphs G11 through G33. Existence of the second peaks P22 indicates that the experimental phase change material layer may be in a crystalline state. Based on the XRD results shown in FIG. 10, the experimental phase change material layer may be crystallized by performing rapid thermal treatment on the experimental phase change material layer at about 300° C. for about 2 minutes in a nitrogen atmosphere, regardless of Si content.

Figure 11:
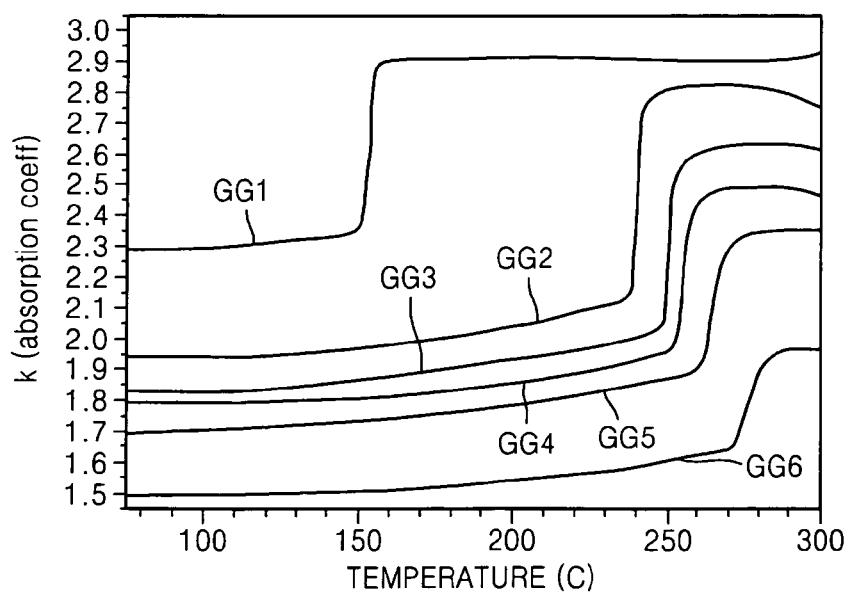
Figure 12:
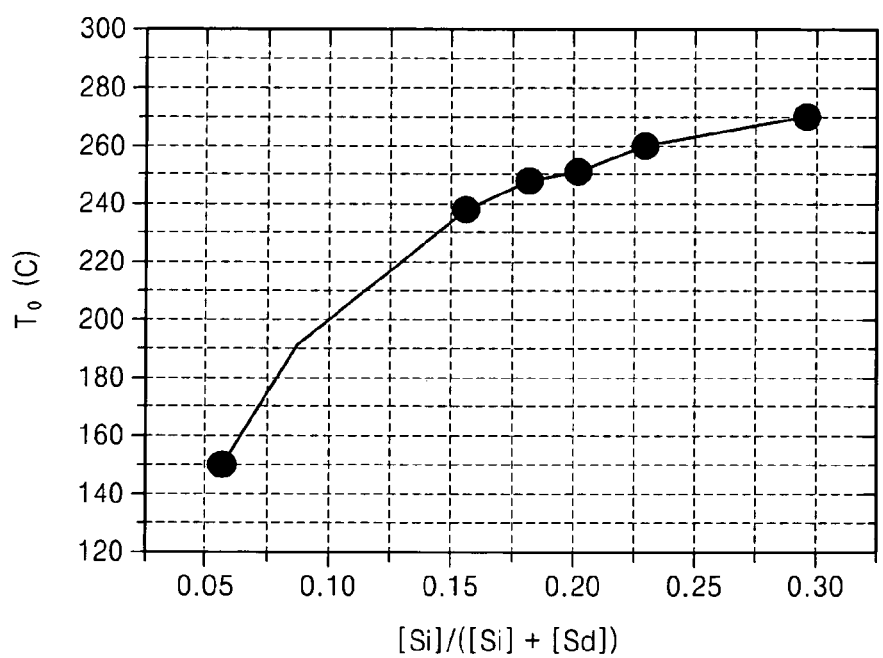

FIG. 11 is a graph showing change of optical absorption coefficients of an experimental phase change material layer according to Si content of the same, the change measured using an ellipsometry. From the change of the optical absorption coefficients, the change in crystallizing temperature Tc of the experimental phase change material layer may be determined as shown in FIG. 12.

Referring to FIG. 11, first through sixth graphs GG1 through GG6 indicate change of optical absorption coefficients k in experimental phase change material layers having Si content [Si/(Si+Sb)] of 0.05, 0.15, 0.18, 0.20, 0.23, and 0.29. In each of the graphs, a temperature at which the optical absorption coefficient may increase is the crystallizing temperature Tc of the particular experimental phase change material layer having Si content corresponding to the specific graph.

Referring to FIG. 11, as Si content [Si/(Si+Sb)] increases, the crystallizing temperature Tc of the experimental phase change material layer may increase from about 150° C. to about 270° C. FIG. 12 is a summary. As shown in FIGS. 11 and 12, the crystallizing temperature Tc of a phase change material layer in a phase change memory device according to example embodiments may be over about 200° C., which may be higher than the crystallizing temperature Tc about 160° C. of a phase change material layer formed of GST in a conventional phase change memory device.

Therefore, the phase change memory device according to example embodiments may prevent or at least reduce unwanted crystallization of the phase change material layer included in the phase change memory device due to an operating condition. In other words, the phase change memory device according to example embodiments may have an improved retention characteristic, which may be an important factor for determining reliability of a memory device.

Figure 13:
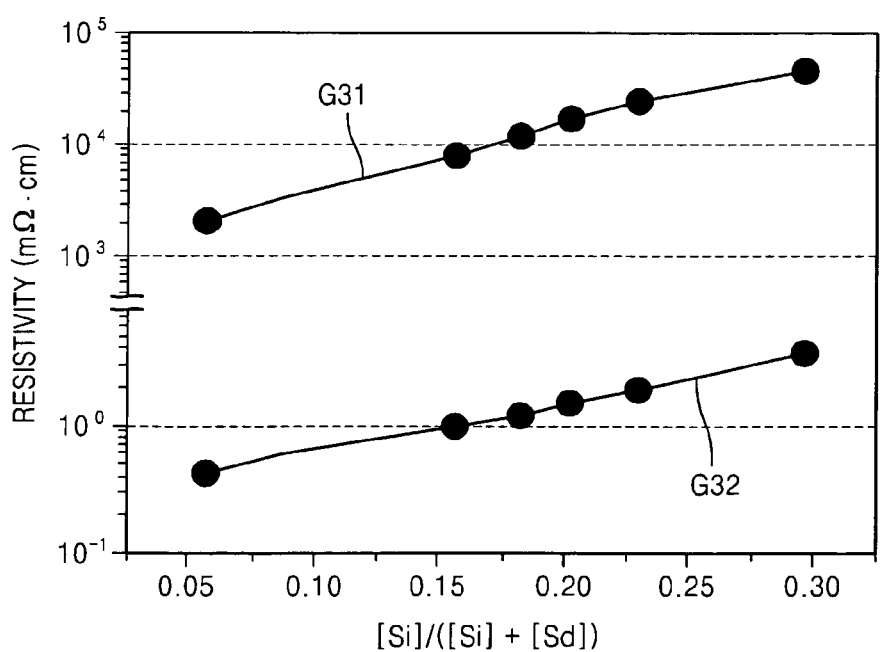

FIG. 13 is a graph showing electrical resistance of an experimental phase change material layer according to Si content [Si/(Si+Sb)]. The electrical resistance of the experimental phase change material layer may be measured by using a 4 point probe. In FIG. 13, a first graph G31 indicates electrical resistance measured just after stacking the experimental phase change material layer, and a second graph G32 indicates electrical resistance measured after crystallizing the stacked experimental phase change material layer by annealing the stacked experimental phase change material layer under the aforementioned thermal treatment condition.

Referring to the first and second graphs G31 and G32 of FIG. 13, a ratio between electrical resistance of the experimental phase change material layer when the experimental phase change material layer is in the amorphous state shown in first graph G31, wherein the electrical resistance will be referred as a reset resistance hereinafter, and electrical resistance of the experimental phase change material layer when the experimental phase change material layer may be crystallized shown in second graph G32, wherein the electrical resistance will be referred as a set resistance hereinafter, and may be equal to or greater than about $10^3$ regardless of the Si content.

Accordingly, because the ratio between the reset resistance and the set resistance may be large, a sensing margin may be extended, and thus errors which may occur while reading data may be reduced. The resistivity of the experimental phase change material layer may be between about 0.4 mΩ.cm and about 5 mΩ.cm when the experimental phase change material layer has the set resistance. The resistivity of the experimental phase change material layer in the set state may be similar to the resistivity of a conventional GST layer, for example, between about 1 mΩ.cm and about 5 mΩ.cm, and the resistivity of the experimental phase change material layer may be controlled by controlling the Si content.

FIGS. 14-19 are power-time-effect (PTE) diagrams showing the phase change rate of experimental phase change material layers having Si contents [Si/(Si+Sb)] of 0.05, 15.6, 18.2, 20.2, 23.2, and 29.6. To measure the phase change rate, the set time of each of the experimental phase change material layers, which may be the time taken for each of the experimental phase change material layers to be crystallized from the amorphous state, may be measured. A shorter set time may mean a faster phase change rate.

To measure the set times, a static laser irradiation method, where a wavelength of a static laser may be about 650 nm, may be used. In other words, a static laser having a wavelength of about 650 nm may be irradiated to an amorphous region of the experimental phase change material layer, and reflectivity of the amorphous region of the experimental phase change material layer may be measured before and after the laser irradiation. When the amorphous region may be crystallized by the laser irradiation, the reflectivity in the amorphous region may be increased.

Figure 14:
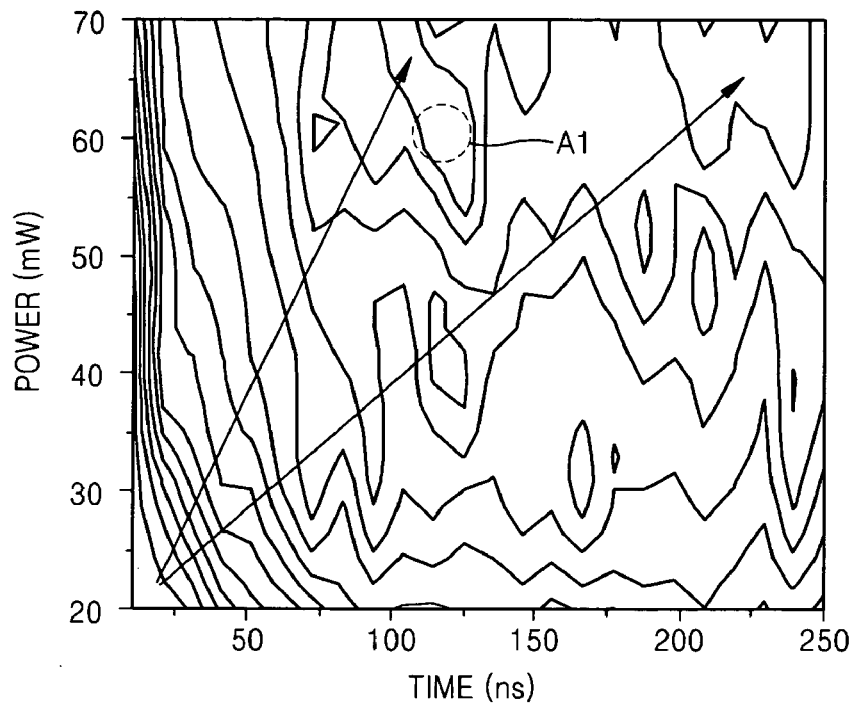
Figure 15:
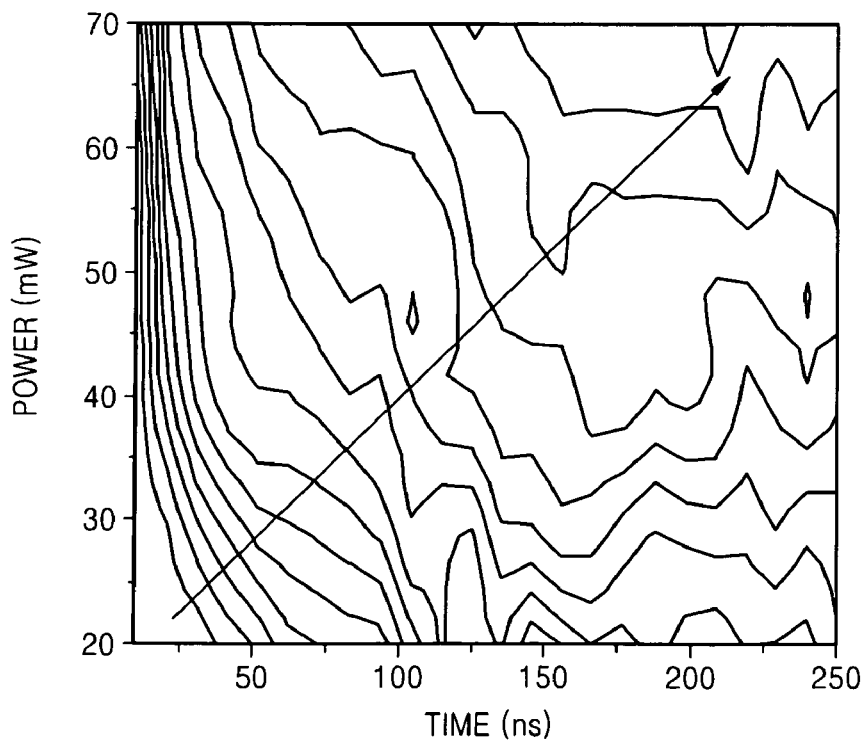
Figure 16:
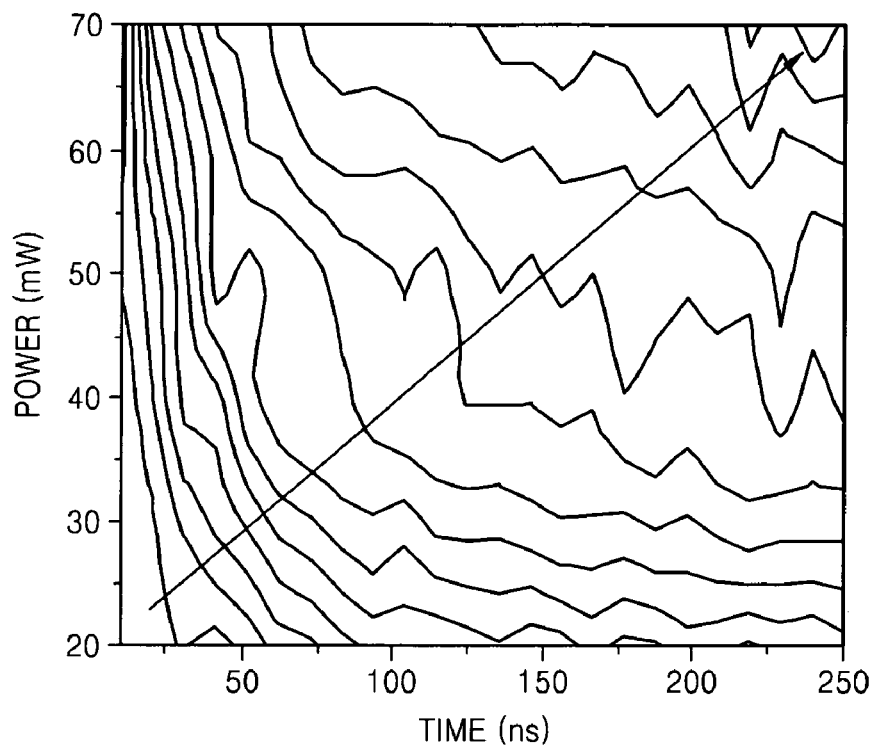
Figure 17:
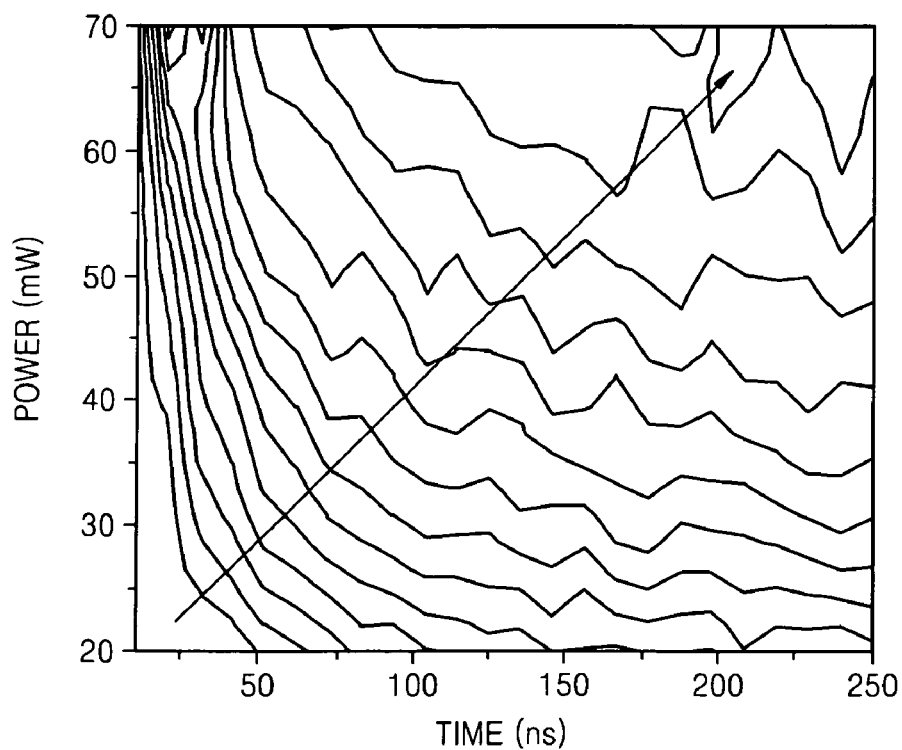
Figure 18:
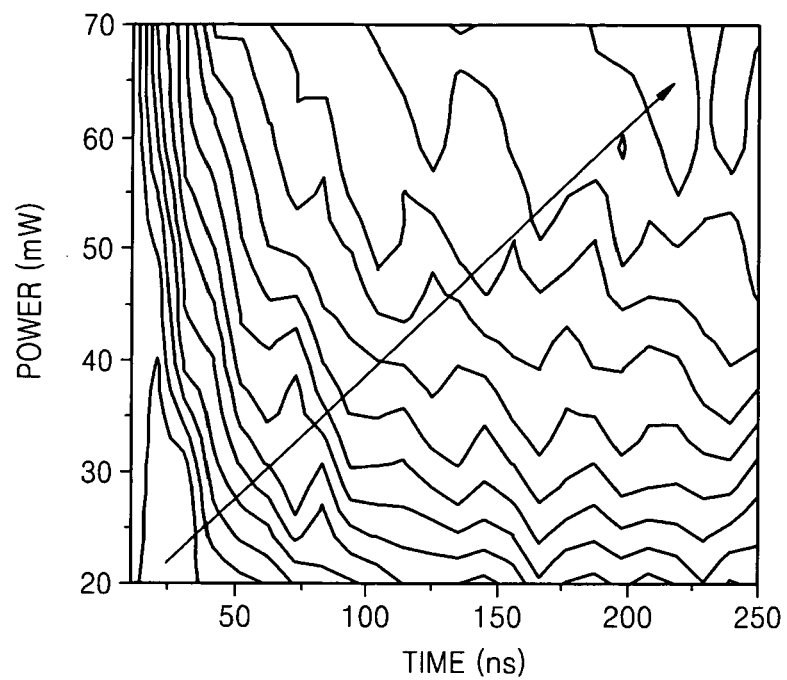
Figure 19:
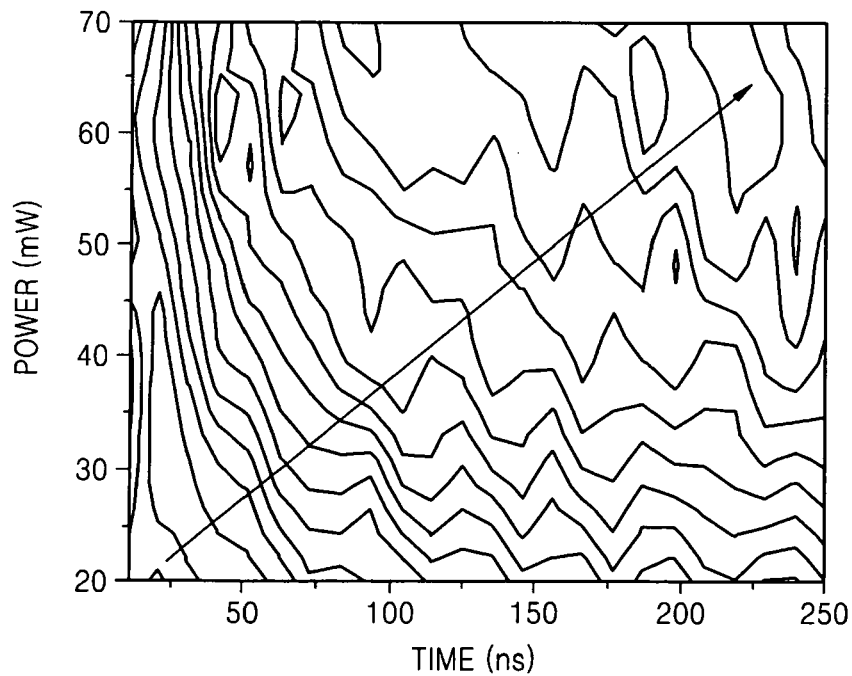
Figure 20:
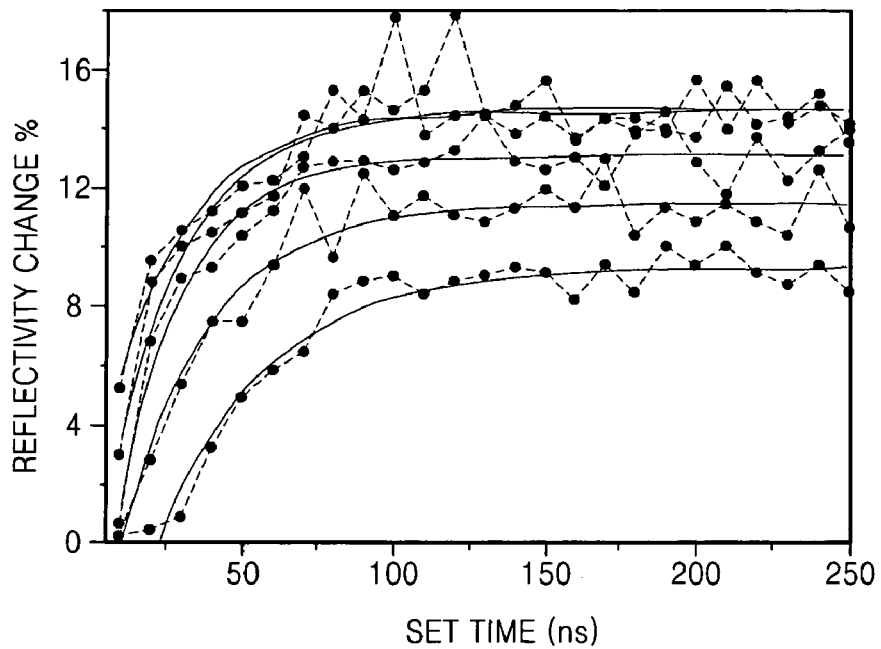
Figure 21:
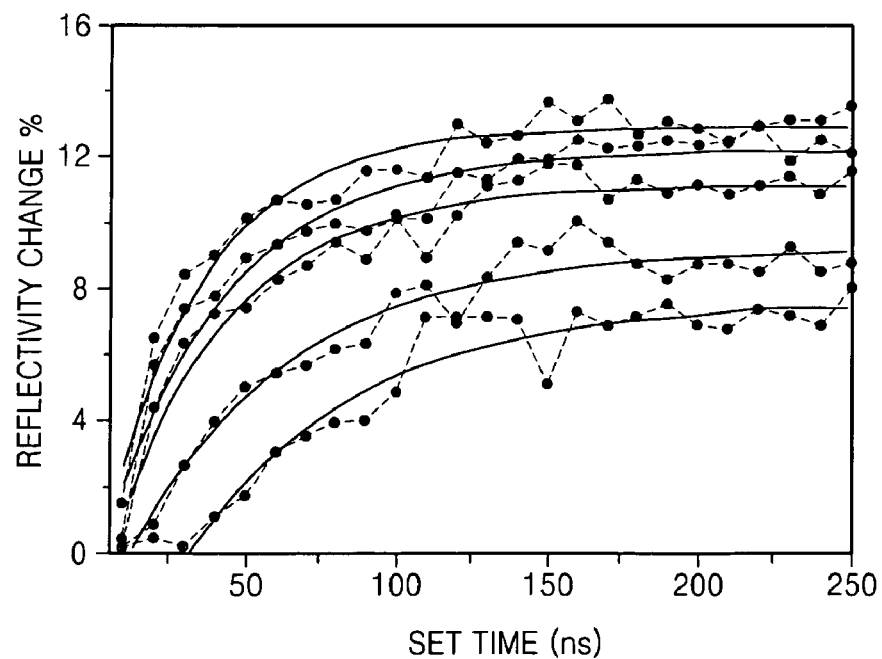
Figure 22:
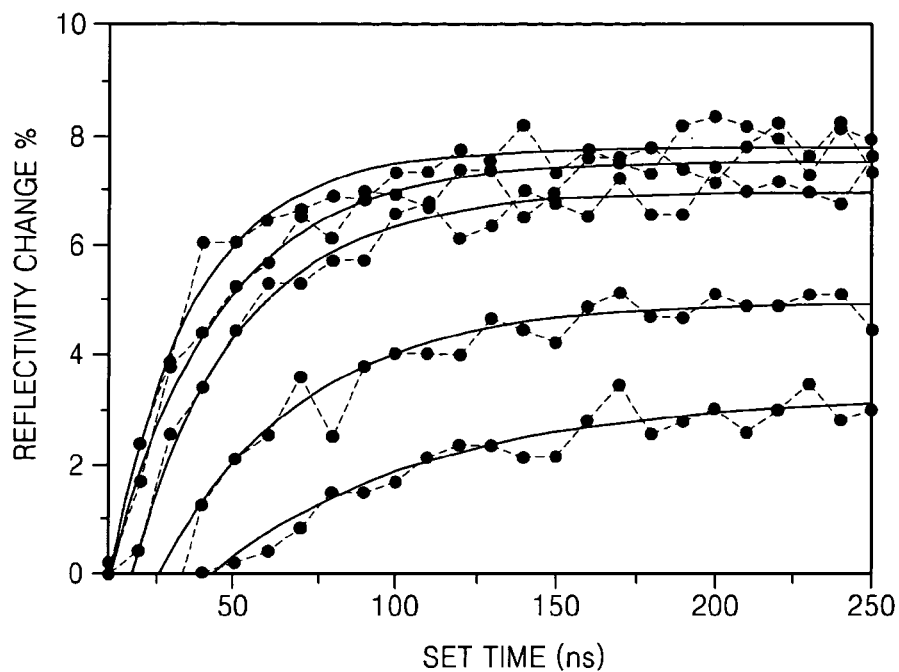
Figure 23:
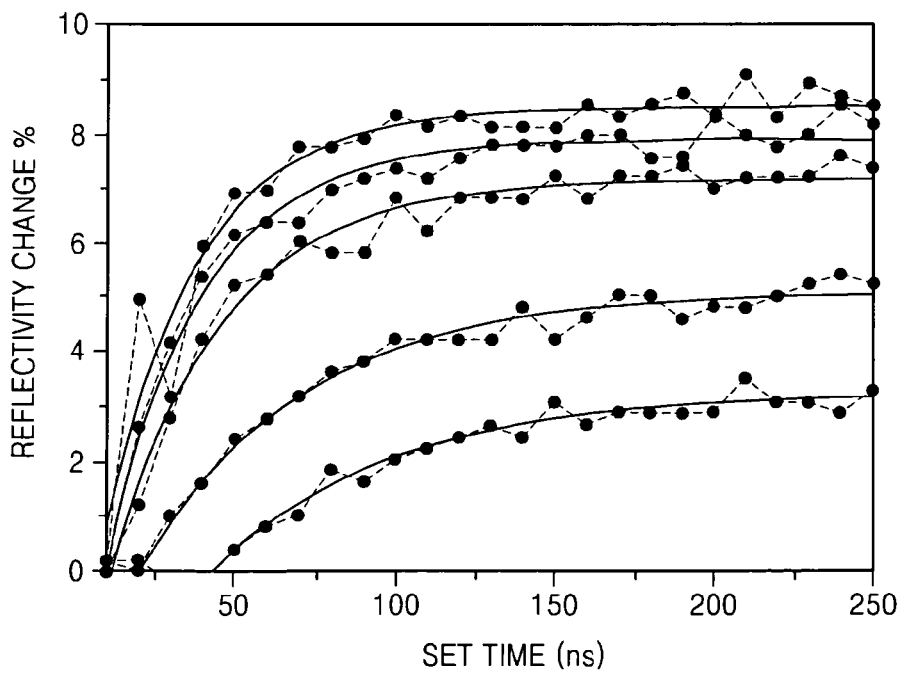
Figure 24:
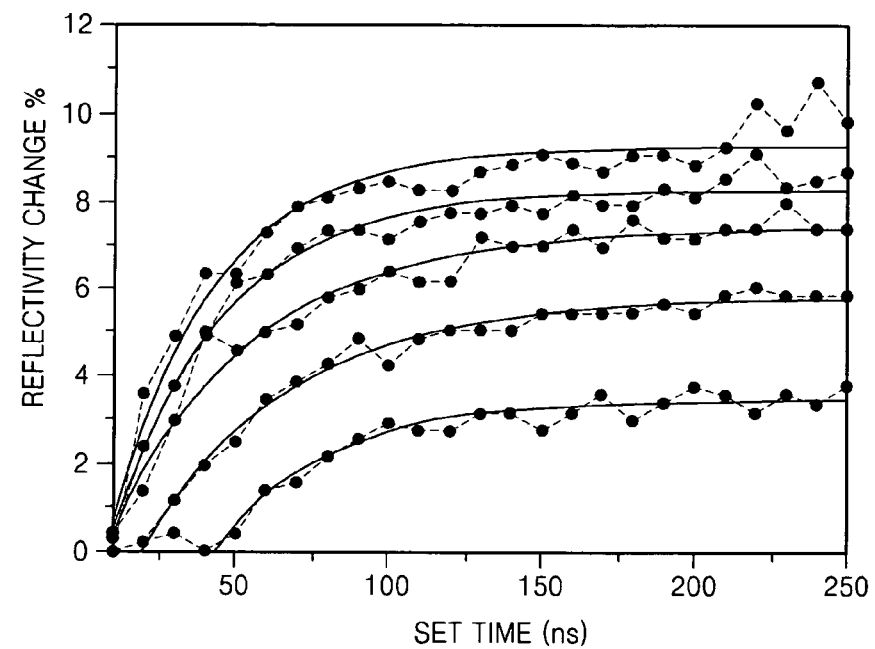
Figure 25:
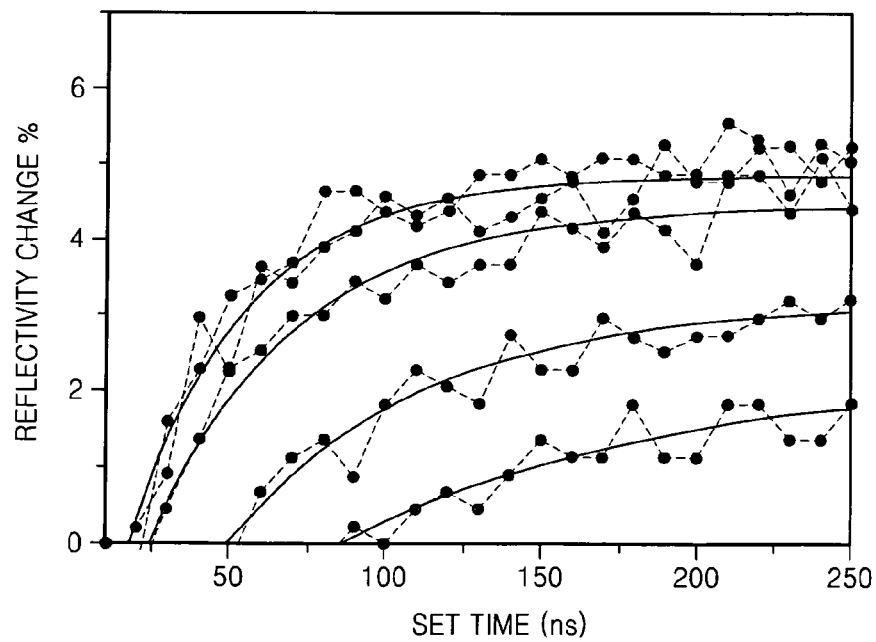

FIGS. 14-19 shows change of reflectivity in the amorphous region of the experimental phase change material layer when the laser with given output power may be irradiated thereto. For example, a first region A1 of FIG. 14 shows change in reflectivity of a region to which about 60 mW of laser may be irradiated for about 120 ns. The first region A1 of FIG. 14 may be a region of which reflectivity may be increased by about 16.7%. The laser irradiation may cause the reflectivity of a region of the experimental phase change material layer to which the laser may be irradiated to be about 16.7% higher than that of the region before the laser irradiation.

In FIGS. 14-19, diagonal arrows indicate a direction in which reflectivity increases. In FIGS. 14-19, a region where the diagonal arrow starts may be a region in which change of reflectivity may be greater than zero. Considering that the change of reflectivity becomes more significant in a direction in which the diagonal arrow extends, reflectivity of the amorphous region of the experimental phase change material layer to which the laser is irradiated may increase significantly.

Therefore, the amorphous region of the experimental phase change material layer may be rapidly crystallized. For example, a crystallization time of the amorphous region of the experimental phase change material layer may be less than 50 ns even when output power of laser irradiated may be between about 20 mW and about 30 mW. Therefore, a set time, which may be the time required for the amorphous region of the experimental phase change material layer to be crystallized, may further be shortened as laser output power increases.

FIGS. 20-25 are graphs showing results of fitting the PTE data shown in FIGS. 14-19, where a John-Mehl-Avrami (JMA) model may be used for the PTE data fitting. Dot graphs shown in each of FIG. 20-25 indicate change of reflectivity according to a set time when output powers of the laser may be 20 mW, 30 mW, 50 mW, 60 mW, and 70 mW, respectively, from the bottom dot graph to the top dot graph, wherein the set time refers to time during which the laser may be irradiated. Solid line graphs shown in FIGS. 20-25 may be fitting graphs corresponding to the dot graphs from the bottom to the top.

Referring to FIGS. 20 through 25, change of reflectivity according to a set time follows the JMA model well when the output powers of the laser may be 20 mW, 30 mW, 50 mW, 60 mW, and 70 mW. Therefore, generation of nuclei for crystallization in the amorphous region and growth reaction of crystal grains from the generated nuclei, occur in sequence when laser may be irradiated to the amorphous region of the experimental phase change material layer or an electrical current may be applied to the experimental phase change material layer such that the amorphous region may be heated as when the laser is irradiated.

The time required for completing the nuclei generation and the growth reaction of crystal grains, for example, time required for the amorphous region of the experimental phase change material layer, to which a laser may be irradiated, to be completely crystallized may be determined based on an initial set time and a final set time. The initial set time may be defined as the time taken for reflectivity of the amorphous region of the experimental phase change material layer to begin to change by the laser irradiation. The final set time may be defined as the time required for the reflectivity of the amorphous region of the experimental phase change material layer to become about 70% of the maximum reflectivity of the amorphous region of the experimental phase change material layer by laser irradiation.

Figure 26:
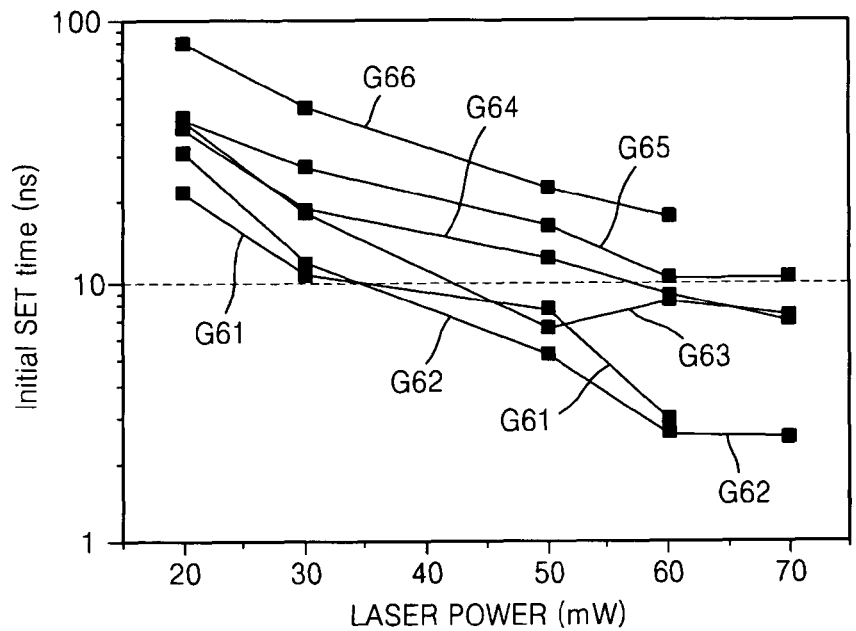
Figure 27:
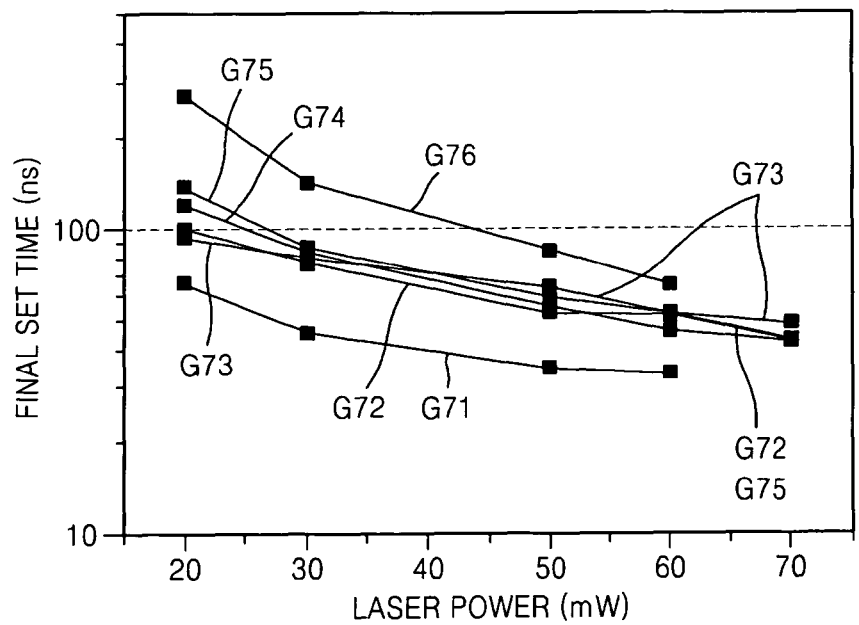

FIG. 26 is a graph showing initial set times of experimental phase change material layers according to output power of laser irradiated to the experimental phase change material layers, wherein the Si content [Si/(Si+Sb)] of the experimental phase change material layers may be 0.05, 0.15, 0.18, 0.20, 0.23, and 0.29, respectively, and FIG. 27 is a graph showing final set times of the experimental phase change material layers under the same conditions. A first graph G61 of FIG. 26 indicates an initial set time of an experimental phase change material layer of which Si content may be 0.05 (5.7 atomic percent). Similarly, second through sixth graphs G62 through G66 refer to initial set times of experimental phase change material layers of which Si contents may be 0.15, 0.18, 0.20, 0.23, and 0.29.

A first graph G71 of FIG. 27 indicates a final set time of the experimental phase change material layer of which Si content may be about 0.05 (about 5.7 atomic percent). Similarly, second through sixth graphs G72 through G76 refer to final set times of the experimental phase change material layers of which Si contents may be about 0.15, 0.18, 0.20, 0.23, and 0.29. Referring to FIG. 26, when output power of laser irradiated is greater than about 30 mW, phase change material layers of which initial set times may be less than about 10 ns may be appeared, where the initial set times may be times elapsed before the beginning of crystallization of the phase change material layers. As the output power of laser increases, initial set times of more phase change material layers may become less than about 10 ns.

Referring to FIG. 27, when output power of laser irradiated is about 20 mW, final set times of portions of the experimental phase change material layers may become less than about 100 ns, where the final set times may be times taken for complete crystallization of amorphous regions of the experimental phase change material layers. When the output power of the laser irradiated is about 30 mW, the final set times of all experimental phase change material layers except the experimental phase change material layers corresponding to the sixth graph G76 may become less than about 100 ns. When the output power of the laser irradiated is about 45 mW, the final set times of all the experimental phase change material layers may become less than about 100 ns. Thus, the final set times of the experimental phase change material layers may become shorter as the output power of the laser irradiated increases. When the output power of the laser is about 60 mW, the shortest final set time of the experimental phase change material layers may be about 30 ns.

Considering that the set time of a conventional GST layer is about 160 ns, the final set times of the experimental phase change material layers may be shorter. Because a phase change memory device according to example embodiments uses one of the experimental phase change material layers, operating speed may be improved.

Figure 28:
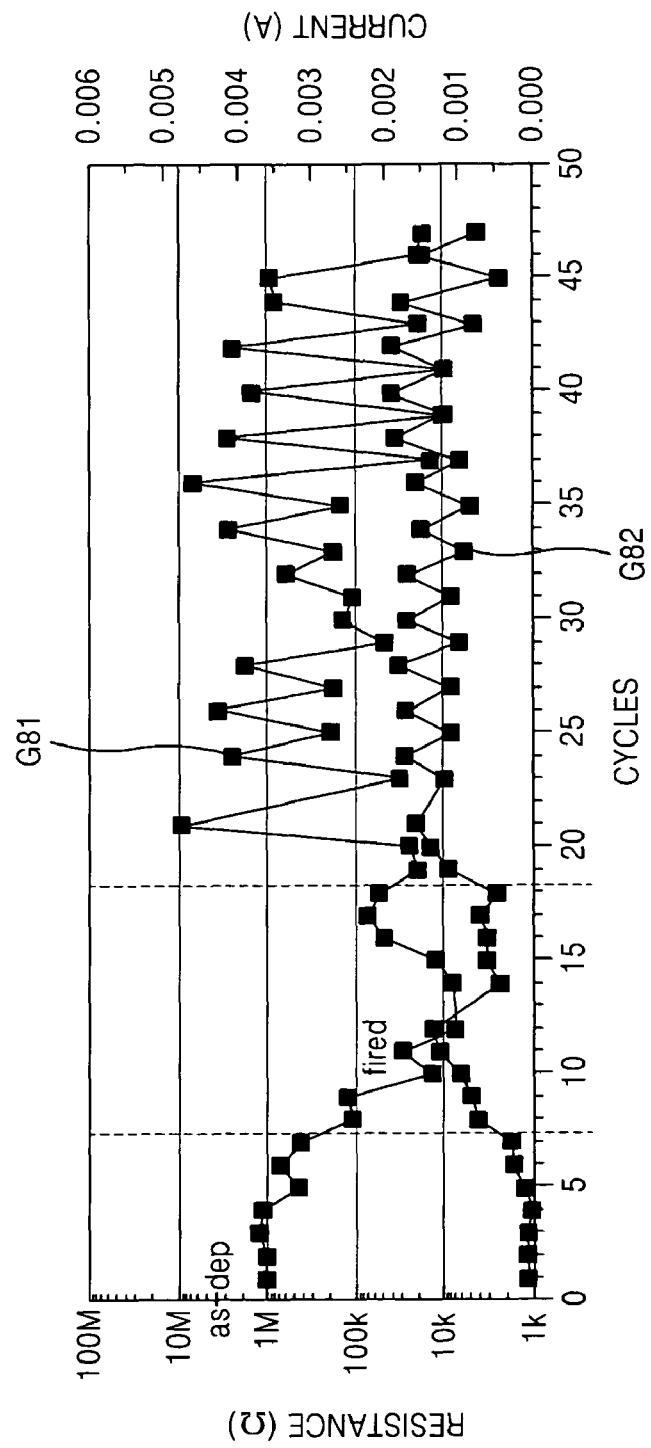

FIG. 28 is a graph showing results of electrical testing a phase change memory device in which an experimental phase change material layer having Si content of about 0.15 (about 15.6 atomic percent) may be used as a phase change material layer. In FIG. 28, a first graph G81 indicates a change in electrical resistance of the phase change material layer according to application of a reset voltage and a set voltage. A second graph G82 indicates a change in electrical current of the phase change material layer according to the change of electrical resistance of the phase change material layer.

The phase change material layer may be in an amorphous state with an electrical resistance of about 1 MΩ just after the phase change material layer may be formed. Before the electrical testing, the amorphous phase change material layer may be thermally treated, so that the phase change material layer may be initially crystallized. Due to the initial crystallization, the electrical resistance of the phase change material layer may become about 10 kΩ. After the initial crystallization, a switching test of the phase change material layer may be performed using a reset voltage of about 5.5V and a set voltage of about 4V. Switching characteristics of the phase change material layer may be examined in terms of reducing set pulse width, which may be the time during which the set voltage may be applied to the phase change material layer from about 1000 ns to about 20 ns. The set pulse duration may correspond to the time of irradiating the laser to the amorphous region of the experimental phase change material layer in the previous experiment.

Figure 29:
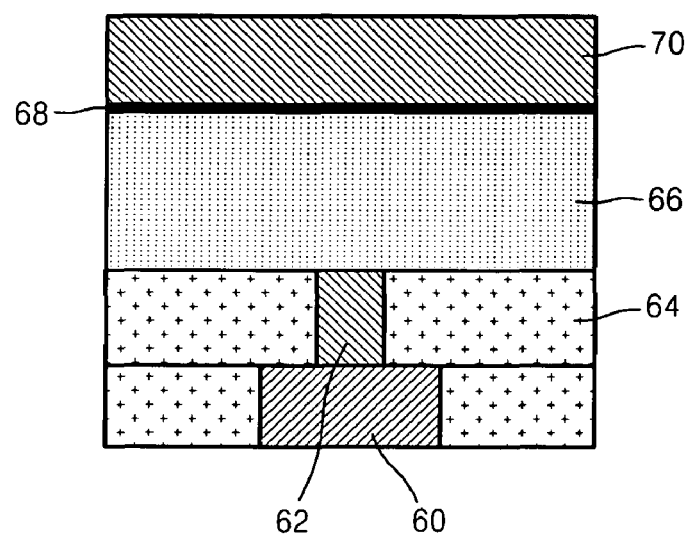

Referring to FIG. 28, electrical switching of the phase change material layer may still be possible even when the set pulse duration may be as short as about 20 ns in the switching test. FIG. 29 is a cross-sectional view of a storage node of the phase change memory device used for the electrical testing of FIG. 28, according to example embodiments. Referring to FIG. 29, the phase change memory device according to example embodiments may include a top electrode 70, a Ti adhesive layer 68, a phase change material layer 66, a bottom electrode contacting layer 62, and a bottom electrode 60. The width of the bottom electrode contacting layer 62 may be about 200 nm. The reset voltage and the set voltage may be applied between the top electrode 70 and the bottom electrode 60. The phase change material layer 66 may be a $Si_6O_{30}Sb_{64}$ layer. The bottom electrode 60 and the bottom electrode contacting layer 62 may be surrounded by an interlayer insulation layer 64. The Ti adhesive layer 68 may be formed between the top electrode 70 and the phase change material layer 66.

To summarize the results of the experiments and the tests aforementioned, a phase change memory device according to example embodiments, in which a Si—O—Sb alloy satisfying the relationship among x, y, and z is used as a phase change material layer, may have advantages as described below. The phase change memory device may have improved thermal stability, because a crystallization temperature Tc of the phase change material layer may be over about 200° C.

A sensing margin may be extended, because a ratio between the reset resistance and the set resistance may be greater than about $10^3$. Therefore, data may be read accurately without errors. Even if errors occur, the frequency of such errors may be minimized or reduced. A set time may be reduced to less than about 100 ns, and as short as about 30 ns as the occasion demands, so that the operating speed of the phase change memory device may be further improved.

Figure 30:
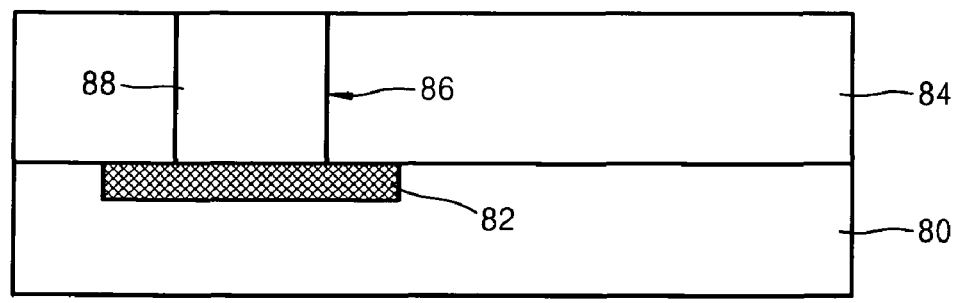
Figure 31:
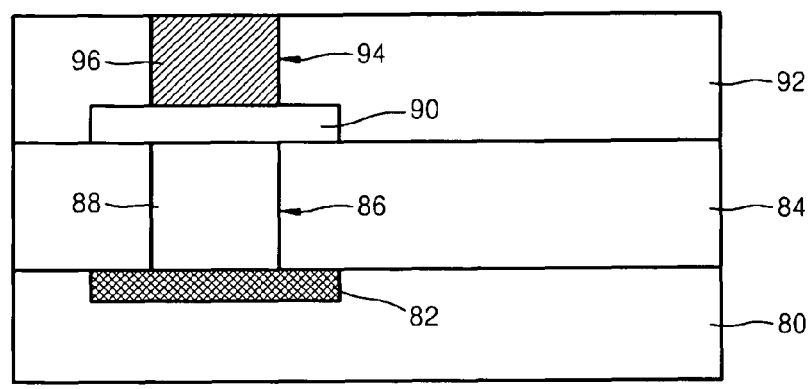
Figure 32:
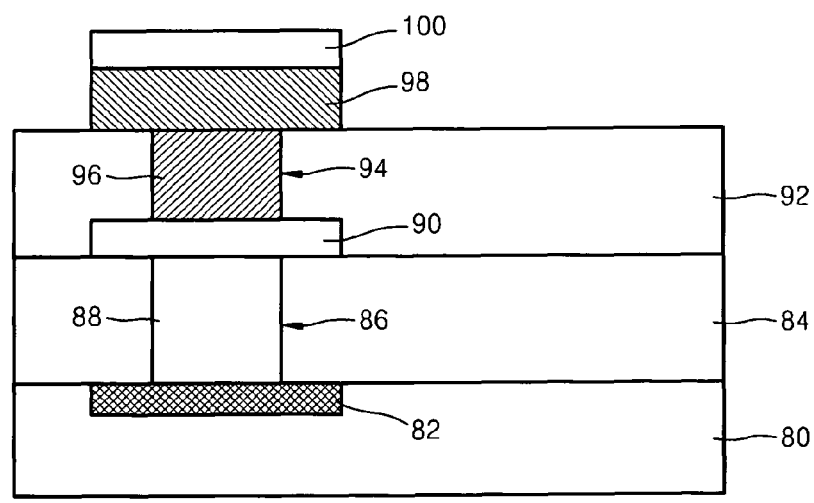

FIGS. 30 through 32 are cross-sectional views illustrating a method of manufacturing a phase change memory device, according to example embodiments. Referring to FIG. 30, an impurity region 82 may be formed on a substrate 80. The substrate 80 may be a p-type silicon substrate, for example. However, example embodiments are not limited thereto, and the substrate 80 may be a different type of substrate. The impurity region 82 may be formed by implanting an impurity opposite in conductivity to that of the substrate 80. The impurity region 82 may be a source region or a drain region of a transistor. For convenience of explanation, forming the impurity region 82 on the substrate 80 may replace forming a transistor on the substrate 80. A first interlayer insulation layer 84 may be formed on the substrate 80. The first interlayer insulation layer 84 may be a silicon oxide layer, a spin-on glass (SOG) layer, or a borophosphosilicate glass (BPSG) layer. A contact hole 86 through which the impurity region 82 may be exposed may be formed in the first interlayer insulation layer 84. The contact hole 86 may be filled with a conductive plug 88. The conductive plug 88 may be a doped silicon layer or other conductive material. When the conductive plug 88 is a metal, an ohmic contact layer (not shown) may further be formed between the conductive plug 88 and the impurity region 82 to reduce ohmic contact resistance.

Referring to FIG. 31, a bottom electrode 90 covering the conductive plug 88 may be formed on the first interlayer insulation layer 84. A second interlayer insulation layer 92 covering the bottom electrode 90 may be formed on the first interlayer insulation layer 84. The second interlayer insulation layer 92 may be formed of the same material as the first interlayer insulation layer 84. A via hole 94 through which the bottom electrode 90 is exposed may be formed in the second interlayer insulation layer 92. The via hole 94 may be filled with a bottom electrode contacting layer 96. The bottom electrode contacting layer 96 may be a TiAlN layer, for example.

Referring to FIG. 32, a phase change material layer 98 covering the bottom electrode contacting layer 96 may be formed on the second interlayer insulation layer 92. The phase change material layer 98 may be the same as the phase change memory device described previously. The phase change material layer 98 may be formed in a co-sputtering apparatus in which a Si target and a Sb target may be installed. In this regard, the composition of the phase change material layer 98 may be adjusted by controlling DC power supplied to the Si target and RF power supplied to the Sb target. Oxygen may naturally flow due to the chemical attraction with silicon during manufacturing operations. Supply of oxygen may also be controlled by using a sputtering gas containing Ar and oxygen.

A top electrode 100 may be formed on the phase change material layer 98. An adhesive layer (not shown) may be formed on the phase change material layer 98 prior to the formation of the top electrode 100. The adhesive layer may be a material layer for improving adhesiveness between the phase change material layer 98 and the top electrode 100 without interrupting flow of electrical current, and may be a titanium layer, for example. The bottom electrode 90, the bottom electrode contacting layer 96, the phase change material layer 98, and the top electrode 100 may constitute a storage node. The bottom electrode 90 and the bottom electrode contacting layer 96 combined may be designated as a bottom electrode. In the description above, the formation of the impurity region 82 replaces the formation of the transistor. However, the impurity region 82 may be simply an impurity region and not replace the transistor. In this case, the substrate 80 and the impurity region 82 may be doped with impurities opposite to each other, and thus, a diode may be formed. Therefore, FIG. 32 may also show a phase change memory device including a diode as a switching device.

A method of operating a phase change memory device, according to example embodiments, will be briefly described with reference to FIG. 32. A switching device formed on the semiconductor substrate 80, where the switching device is a transistor or a diode, may be turned on. A predetermined or given voltage may be applied between the bottom electrode 90 and the top electrode 100. The voltage may be a writing voltage for writing data to the phase change material layer 98. The voltage may also be a reading voltage for reading data stored in the phase change material layer 98. The voltage may also be an erasing voltage for erasing data stored in the phase change material layer 98.

While example embodiments have been particularly shown and described with reference to example embodiments thereof, it will be understood by those of ordinary skill in the art that various changes in form and details may be made therein without departing from the spirit and scope of the following claims. For example, those of ordinary skill in the art may be able to change the configuration of a layer above or below a phase change material layer without modifying the phase change material layer itself. Also, elements other than Si, O, and Sb may be included in the Si—O—Sb alloy used to form a phase change material layer. Also, a switching device other than a transistor or a diode may be used.

What is claimed is:

1. A phase change material comprising an alloy composed of silicon (Si), antimony (Sb) and oxygen (O), wherein the alloy is in the form of Si—O—Sb.

2. The phase change material of claim 1, wherein the alloy in the form of Si—O—Sb is $Si_xO_ySb_z$, and wherein when $x/(x+z)$ is x1, about $0.05 \leq x1 \leq$ about $0.30$, about $0.00 \leq y \leq$ about $0.50$, and $x+y+z$ is 1.

3. The phase change material of claim 1, wherein the Si—O—Sb alloy further comprises an element other than Si, O, and Sb.

4. A phase change memory device comprising:
a switching device; and
a storage node connected to the switching device,
wherein the storage node includes a layer composed of the phase change material of claim 1.

5. The phase change memory device of claim 4, wherein the alloy in the form of Si—O—Sb is $Si_xO_ySb_z$, and wherein when $x/(x+z)$ is x1, about $0.05 \leq x1 \leq$ about $0.30$, about $0.00 \leq y \leq$ about $0.50$, and $x+y+z$ is 1.

6. The phase change memory device of claim 4, wherein the Si—O—Sb alloy further comprises an element other than Si, O, and Sb.

7. A method of manufacturing a phase change memory device, the method comprising:
   forming a switching device; and
   forming a storage node,
   wherein forming the storage node includes:
      forming a lower layer connected to the switching device;
      forming a phase change material layer on the lower layer; and
      forming an upper layer on the phase change material layer, and
   wherein the phase change material layer is formed of a phase change material including an alloy composed of Si, Sb and O, the alloy being in the form of Si—O—Sb.

8. The method of claim 7, wherein the alloy in the form of Si—O—Sb is $Si_xO_ySb_z$, and wherein when $x/(x+z)$ is x1, about $0.05 \leq x1 \leq$ about $0.30$, about $0.00 \leq y \leq$ about $0.50$, and $x+y+z$ is 1.

9. The method of claim 7, wherein the Si—O—Sb alloy is formed using a co-sputtering method using a Si target and a Sb target.

10. The method of claim 9, wherein DC power is applied to the Si target, and RF power is applied to the Sb target.

11. The method of claim 7, wherein the Si—O—Sb alloy further comprises an element other than Si, O, and Sb.

12. A method of operating a phase change memory device comprising:
   maintaining a switching element connected to a phase change memory layer in an ON state; and
   applying an operating voltage to the phase change memory layer between upper and lower layers,
   wherein the phase change material layer is formed of a phase change material including an alloy composed of Si, Sb and O, the alloy being in the form of Si—O—Sb.

13. The method of claim 12, wherein the alloy in the form of Si—O—Sb is $Si_xO_ySb_z$, and wherein when $x/(x+z)$ is x1, about $0.05 \leq x1 \leq$ about $0.30$, about $0.00 \leq y \leq$ about $0.50$, and $x+y+z$ is 1.

14. The method of claim 12, wherein the Si—O—Sb alloy further comprises an element other than Si, O, and Sb.

* * * * *